US012685132B2

(12) United States Patent
Kuo et al.

(10) Patent No.: US 12,685,132 B2
(45) Date of Patent: Jul. 14, 2026

(54) ALUMINUM STRUCTURES

(71) Applicant: Taiwan Semiconductor Manufacturing Company, Ltd., Hsinchu (TW)

(72) Inventors: Chia-Pang Kuo, Taoyuan (TW); Sean Yang, Taipei (TW); Yue-Guo Lin, Hsinchu (TW); Tsai Hsi-Chen, Hsinchu (TW); Chi-Feng Lin, Hsinchu (TW); Hung-Wen Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 669 days.

(21) Appl. No.: 18/179,676

(22) Filed: Mar. 7, 2023

(65) Prior Publication Data

US 2024/0304551 A1       Sep. 12, 2024

(51) Int. Cl.
 *H01L 23/532* (2006.01)
 *H10W 20/00* (2026.01)
 *H10W 20/41* (2026.01)

(52) U.S. Cl.
 CPC ....... *H10W 20/425* (2026.01); *H10W 20/074* (2026.01); *H10W 20/435* (2026.01)

(58) Field of Classification Search
 CPC ......... H01L 23/53223; H01L 21/76829; H01L 23/5283; H01L 21/76832; H01L 21/76834; H01L 21/76885; H01L 23/53238; H01L 23/53295
 See application file for complete search history.

(56) References Cited

U.S. PATENT DOCUMENTS

| | | | |
|---|---|---|---|
| 6,069,070 A * | 5/2000 | Labunov ........... | H01L 21/02258 257/E23.125 |
| 10,026,649 B2 | 7/2018 | Shusterman et al. | |
| 2013/0168867 A1 * | 7/2013 | Shim ................. | H01L 21/76897 438/626 |

FOREIGN PATENT DOCUMENTS

| TW | 194556 B | 11/1992 |
|---|---|---|
| TW | 201639035 A | 11/2016 |
| TW | 201917917 A | 5/2019 |

* cited by examiner

*Primary Examiner* — Karen Kusumakar
(74) *Attorney, Agent, or Firm* — Ingrassia Fisher & Lorenz, LLP | IF&L

(57) ABSTRACT

Devices with aluminum structures and methods of fabrication are provided. An exemplary device includes an interconnect structure and an aluminum structure electrically connected to the interconnect structure. The aluminum structure includes a first aluminum layer, a migration barrier layer over the first aluminum layer, and a second aluminum layer over the migration barrier layer.

20 Claims, 8 Drawing Sheets

200

Z

X

200

ALUMINUM STRUCTURES

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
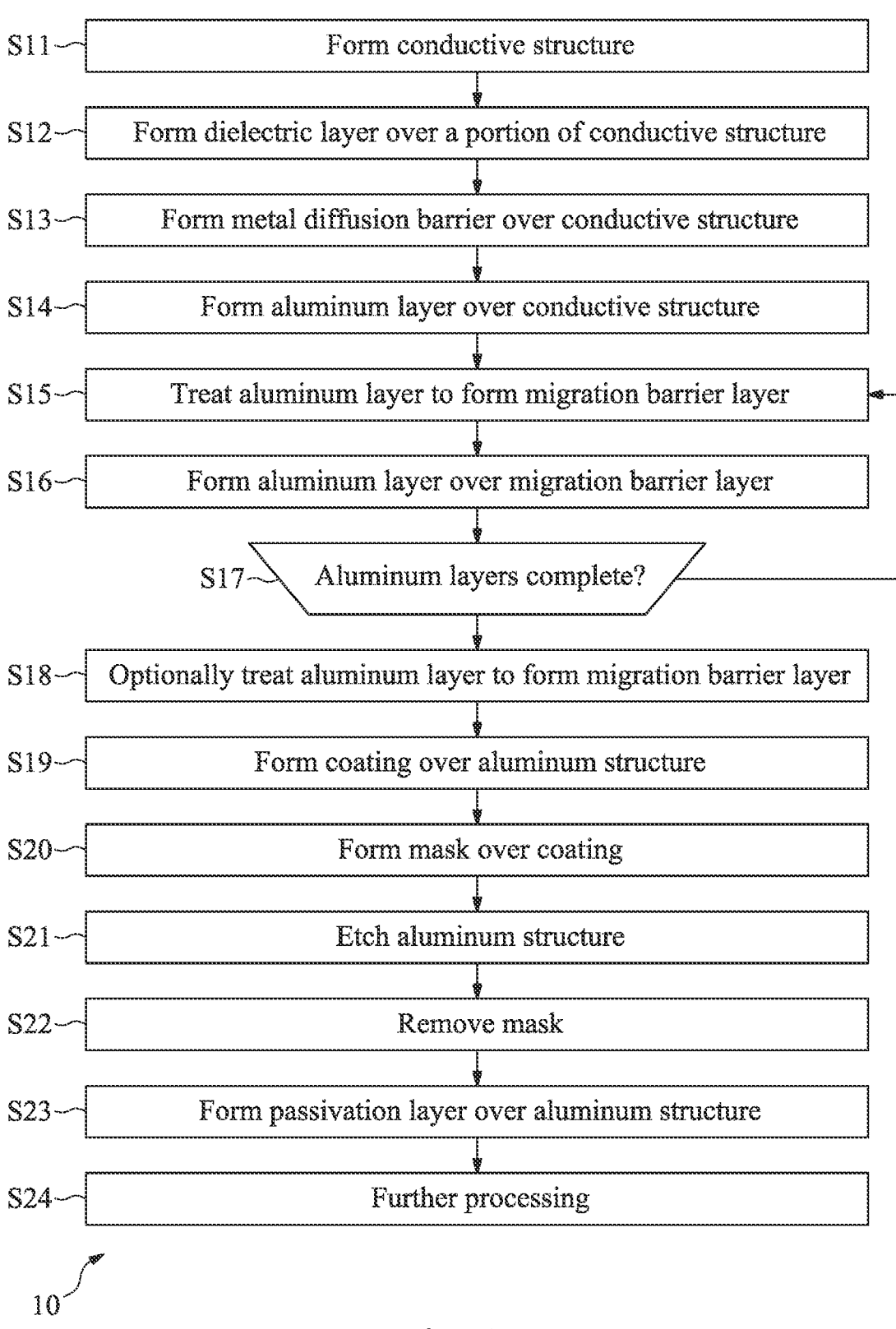
FIG. 1 is a flow chart illustrating a method, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a layer that is a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of an aluminum layer and a layer of aluminum is a layer that is at least 50 wt. %, at least 60 wt. %, at least 75 wt. %, at least 90 wt. %, at least 95 wt. %, or at least 99 wt. % of aluminum.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It is noted that this disclosure presents certain embodiments of aluminum structures in the form of conductive lines and/or conductive vias. Further, certain embodiments of aluminum structures are in the form of aluminum pads used as the final backend-of-the-line (BEOL) interconnect layer under the under-bump metallization (UBM) and bumping. However, embodiments herein are not so limited.

Diffusion of vacancies through aluminum may cause formation of voids in the aluminum. For example, vacancies may diffuse through thermal induced stress gradient. It has been found that aluminum structures may exhibit voiding after thermal cycling. For example, thermal cycling at 300 cycles between −65° C. and 150° C. has shown significant voiding. Any aluminum voiding increases the risk of yield degradation and reliability, such as through electro migration (EM) or stress migration (SM) failure. Aluminum voiding is particularly serious when an aluminum structure has a small width, such as less than two micrometers, because the stress gradient in the aluminum structure increases as the aspect ratio increases, i.e., as the aluminum structure width decreases. Thus, it is desirable to block vacancy diffusion to minimize voiding.

Herein, embodiments may minimize voiding by forming an inert aluminum oxide, aluminum nitride, and/or aluminum oxynitride layer between aluminum layers. Further, embodiments herein may form such an inert layer by interrupting an aluminum deposition process by performing a vacuum/break air exposure and nitrogen, oxygen, and/or nitrous oxide plasma treatment of the upper surface of the deposited aluminum, and then by continuing the aluminum deposition process. Such processing is easily integrated into existing aluminum deposition schemes.

Presented herein are embodiments of aluminum structures and of methods for forming aluminum structures and/or for fabricating semiconductor devices with aluminum structures. In certain embodiments, electro migration (EM) and/or stress migration (SM) within aluminum structures are mitigated through the inclusion of a migration barrier in the aluminum structures. In exemplary embodiments, the migration barrier comprises aluminum. For example, the migration barrier may be formed from treating an upper surface of an aluminum layer to form a treated aluminum layer, such as a ceramic aluminum layer. In certain embodiments, the migration barrier layer is aluminum oxide, aluminum nitride, and/or aluminum oxynitride. The migration barrier layer may be formed by performing a plasma ionization process on the surface of the aluminum layer.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods for forming aluminum structures including aluminum layers separated by a migration barrier. Embodiments herein provide for treating an aluminum layer to form a migration barrier on the surface of the aluminum layer and for forming another aluminum layer over the migration barrier. Reduction in electro migration and/or stress migration provided by the migration barrier may reduce the formation of voids and improve the performance of the semiconductor device. Less voiding may result from introducing an inert and low coefficient of thermal expansion (CTE) $AlO_xN_y$, layer into the aluminum structure. The resulting dual-layer aluminum structure may have better thermal stability and SM/EM performance. Further, the process described herein may be easily integrated into the current process flow.

For purposes of the discussion that follows, FIG. 1 provides a flow chart for a method 10 for forming an aluminum structure 100 during a semiconductor fabrication process. Method 10 is described below with reference to FIGS. 2-10 which illustrate the semiconductor device 200 at various stages of fabrication according to method 10 and to FIGS. 11-15, which are focused views of illustrated and alternate embodiments of aluminum structures 100 formed by method 10. FIGS. 2-15 are cross-sectional "y-cut" views in which the vertical direction is defined by the z-axis and the lateral direction is defined by the x-axis. It is understood that method 10 includes steps having features of a complementary metal-oxide-semiconductor (CMOS) technology process flow and thus, are only described briefly herein. Also, additional steps may be performed before, after, and/or during method 10.

Figure 2:
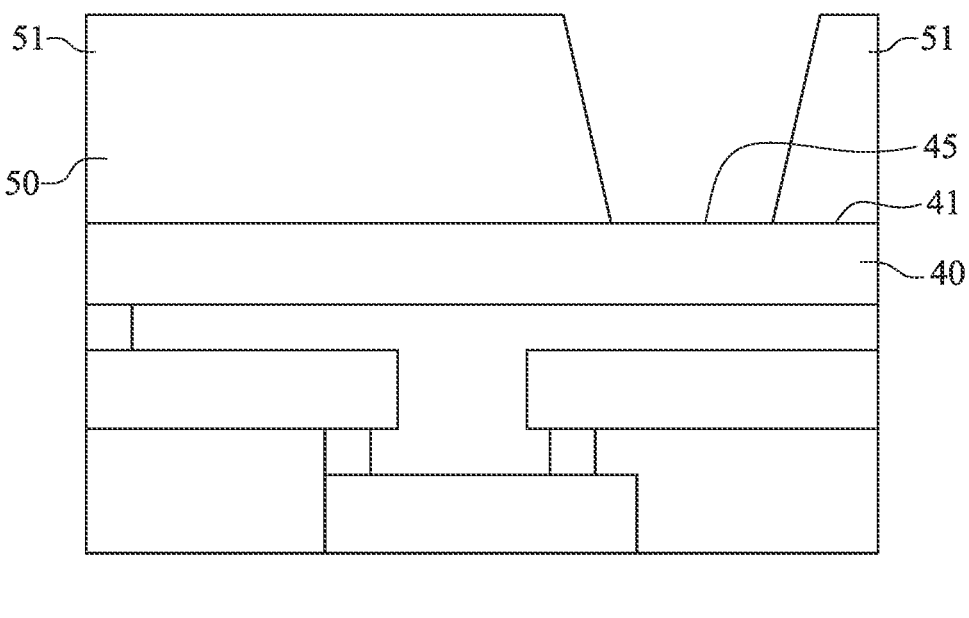
FIGS. 2-10 are cross-sectional views of a device during successive stages of fabrication according to the method of FIG. 1, in accordance with some embodiments.
Figure 2:
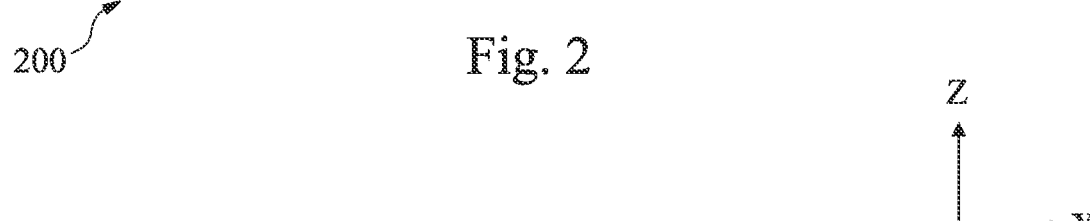

Referring now to FIGS. 1 and 2, a method 10 for fabricating a semiconductor device 200 includes, at S11, forming a conductive structure 40 over substrate (not shown). In an exemplary embodiment, the conductive structure 40 is formed during a backend-of-the-line (BEOL) process where interconnects are formed within the semiconductor device 200. In other words, the conductive structure 40 is a BEOL interconnect. In an exemplary embodiment, the conductive structure 40 is copper. In an exemplary embodiment, the conductive structure 40 is formed by a damascene process. For example, an etch process forms a gap and a thin barrier layer of tantalum (Ta) and tantalum nitride (TaN) materials are deposited using physical vapor deposition (PVD). Ta is used to form the liner and TaN is for the barrier. The barrier layer is coated over by a copper seed barrier. Finally, the structure is electroplated with copper and ground flat using chemical mechanical polishing to an upper surface 41.

Method 10 further includes, at S12, forming a dielectric layer over at least a portion of the conductive structure 40. For example, a dielectric layer 50 is deposited over the surface 41 of the conductive structure 40 and is patterned to form dielectric segments 51. As a shown, a portion 45 of the upper surface 41 of the conductive structure 40 is not covered by the dielectric segments 51. In exemplary embodiments, the dielectric layer 50 and segments 51 are silicon oxide ($SiO_2$).

Figure 3:
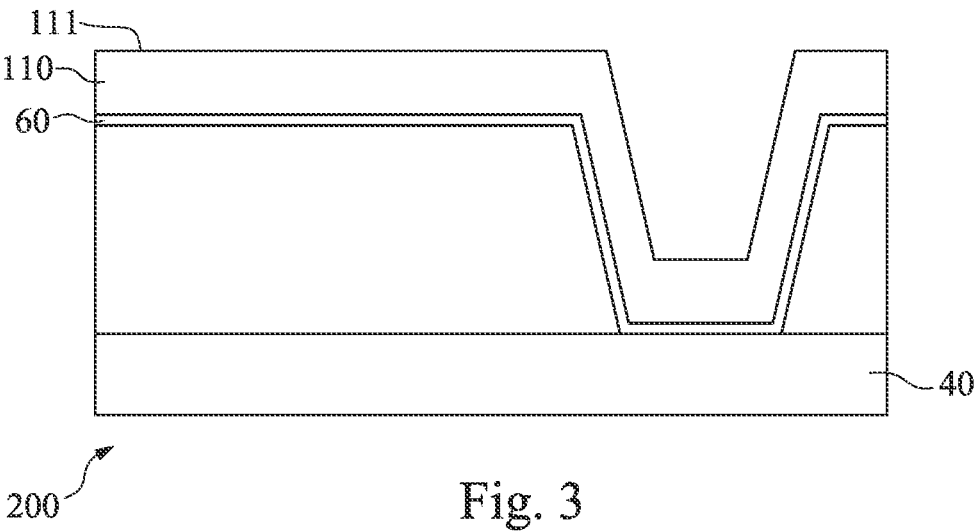

Cross-referencing FIGS. 1 and 3, method 10 further includes, at S13, forming a metal diffusion barrier 60 over the conductive structure 40. For example, method 10 may include depositing a barrier material such as tantalum nitride (TaN) or titanium nitride (TiN). In exemplary embodiments, the barrier material is conformally deposited over the dielectric segments 51 and over the uncovered portion 45 of the upper surface 41 of the conductive structure 40. For example, the barrier material may be deposited by an atomic layer deposition (ALD) process.

Method 10 further includes, at S14, forming an aluminum layer 110 over the conductive structure 40. For example, method 10 may include depositing aluminum 110 onto the metal diffusion barrier 60. In an exemplary embodiment, the aluminum 110 is deposited by a physical vapor deposition (PVD) hot aluminum reflow process. For example, a PVD metal layer of aluminum is deposited before reflowing additional aluminum deposited by physical vapor deposition on the conformal PVD aluminum layer. As shown, the aluminum 110 is formed with an upper surface 111.

Figures 4, 5:
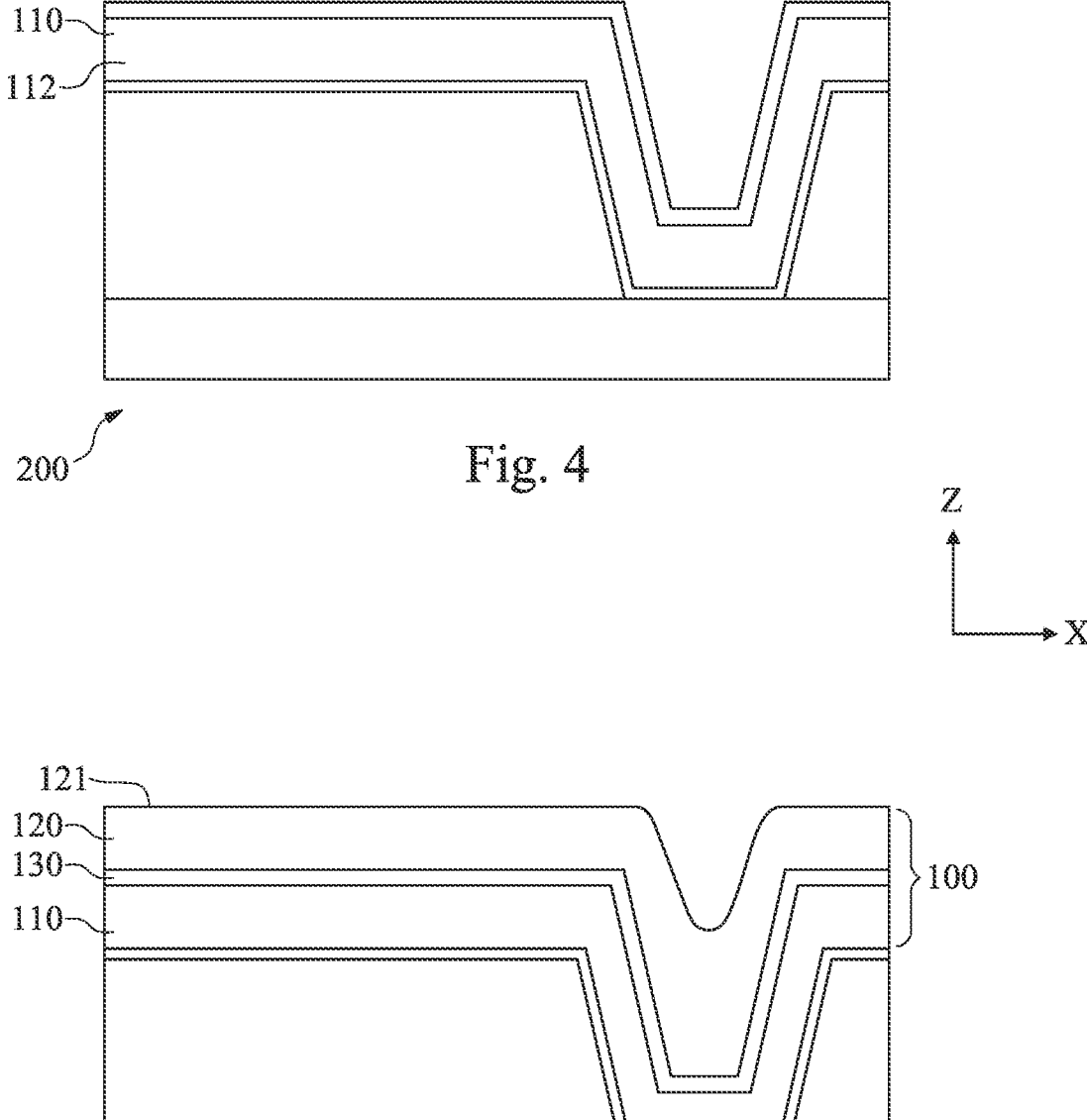

Cross-referencing FIGS. 1 and 4, method 10 further includes, at S15, treating the aluminum layer 110 to form a migration barrier layer 130. In an exemplary embodiment, the upper surface 111 of the aluminum layer 110 is converted to the migration barrier layer 130. A remainder 112 of the aluminum layer 110 under the migration barrier layer 130 remains unmodified aluminum. In an exemplary embodiment, treating the upper surface 111 of the aluminum layer 110 to form the migration barrier layer 130 includes forming an aluminum nitride layer, an aluminum oxide layer, and/or an aluminum oxynitride layer as the migration barrier layer 130. In an exemplary embodiment, treating the upper surface 111 of the aluminum layer 110 to form the migration barrier layer 130 includes forming a ceramic layer from the upper surface 111. In certain embodiments, treating the upper surface 111 of the aluminum layer 110 to form the migration barrier layer 130 includes performing a vacuum break. In such embodiments, native aluminum oxide is thus generated on the aluminum layer 110. In other embodiments, treating the upper surface 111 of the aluminum layer 110 to form the migration barrier layer 130 includes performing a plasma ionization process with oxygen ($O_2$), nitrogen ($N_2$), and/or nitrous oxide ($N_2O$). In such a process, oxygen and/or nitrogen ions penetrate into the aluminum layer 110 to modify the upper surface 111. The migration barrier layer 130 may be considered to be $AlO_xN_y$, where either x or y, but not both, may be zero. In exemplary embodiments, the migration barrier layer 130 includes passivated $Al_2O_3$, passivated AlN, or mixed $AlO_xN_y$.

In exemplary embodiments, the plasma ionization process is performed at a temperature of from 25 to 400° C., at a pressure of from 0.001 to 10 torr, and for a time duration of from 10 to 120 seconds.

Cross-referencing FIGS. 1 and 5, method 10 further includes, at S16, forming an aluminum layer 120 over the conductive structure 40. For example, method 10 may include depositing aluminum 120 onto the migration barrier layer 130. In an exemplary embodiment, the aluminum 120 is deposited by a physical vapor deposition (PVD) hot aluminum reflow process. For example, a PVD metal layer of aluminum is deposited before reflowing additional aluminum deposited by physical vapor deposition on the conformal PVD aluminum layer. As shown, the aluminum 120 is formed with an upper surface 121. In certain embodiments, the aluminum layer 110, migration barrier layer 130, and aluminum layer 120 for the aluminum structure 100.

Method 10 includes, at S17, determining whether further aluminum layers are desired, i.e., whether the aluminum structure 100 formed by the aluminum layers is complete. If not, method 10 continues from S15, wherein the upper surface of the last deposited aluminum layer, such as upper surface 121 of aluminum layer 120, is treated to form another migration barrier layer 130.

When sufficient aluminum layers are formed, method 10 may continue at S18, with optionally treating the last-deposited aluminum layer to form another migration barrier layer 130, such as with the process described above in relation to S15. It is noted that in the embodiment of FIGS. 1-10, only two aluminum layers are desired and method 10 proceeds from S17 directly to S18. Also, in the illustrated embodiment, no additional migration barrier layer 130 is formed at S18.

Figures 6, 7:
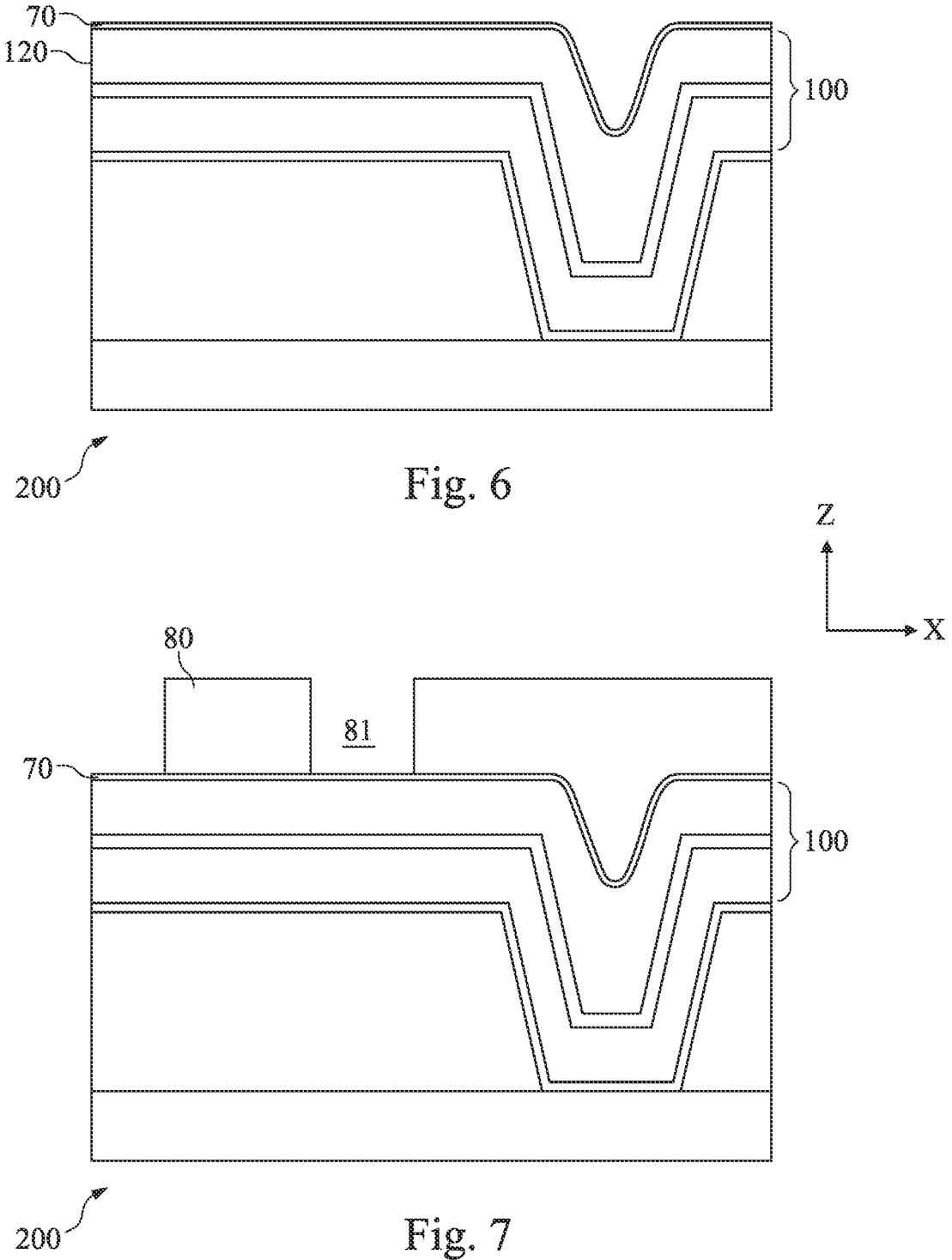

Cross-referencing FIGS. 1 and 6, method 10 further includes, at S19, forming a coating 70 over the aluminum structure 100, such as on aluminum layer 120. In an exemplary embodiment the coating 70 is an antireflective coating (ARC). An exemplary coating 70 is silicon oxycarbide (SiOC).

Cross-referencing FIGS. 1 and 7, method 10 further includes, at S20, forming a mask 80 over the coating 70. For example, a photoresist layer may be coated/deposited over the device 200 and exposed and developed according to a conventional photolithographic patterning process to form a mask 80 defining an anisotropic etching pattern with holes 81 for openings, such as high aspect ratio via openings. In exemplary embodiments, a deep ultraviolet chemically amplified (DUV) photoresist used for patterning the openings may include an activating radiation source with a wavelength of less than about 250 nm, for example, from about 193 nm to about 250 nm, to expose the photoresist layer. The photoresist layer may be any conventional DUV photoresist layer including a multi-layered photoresist including, for example, a chemically amplified resist producing a photogenerated acid.

Figures 8, 9:
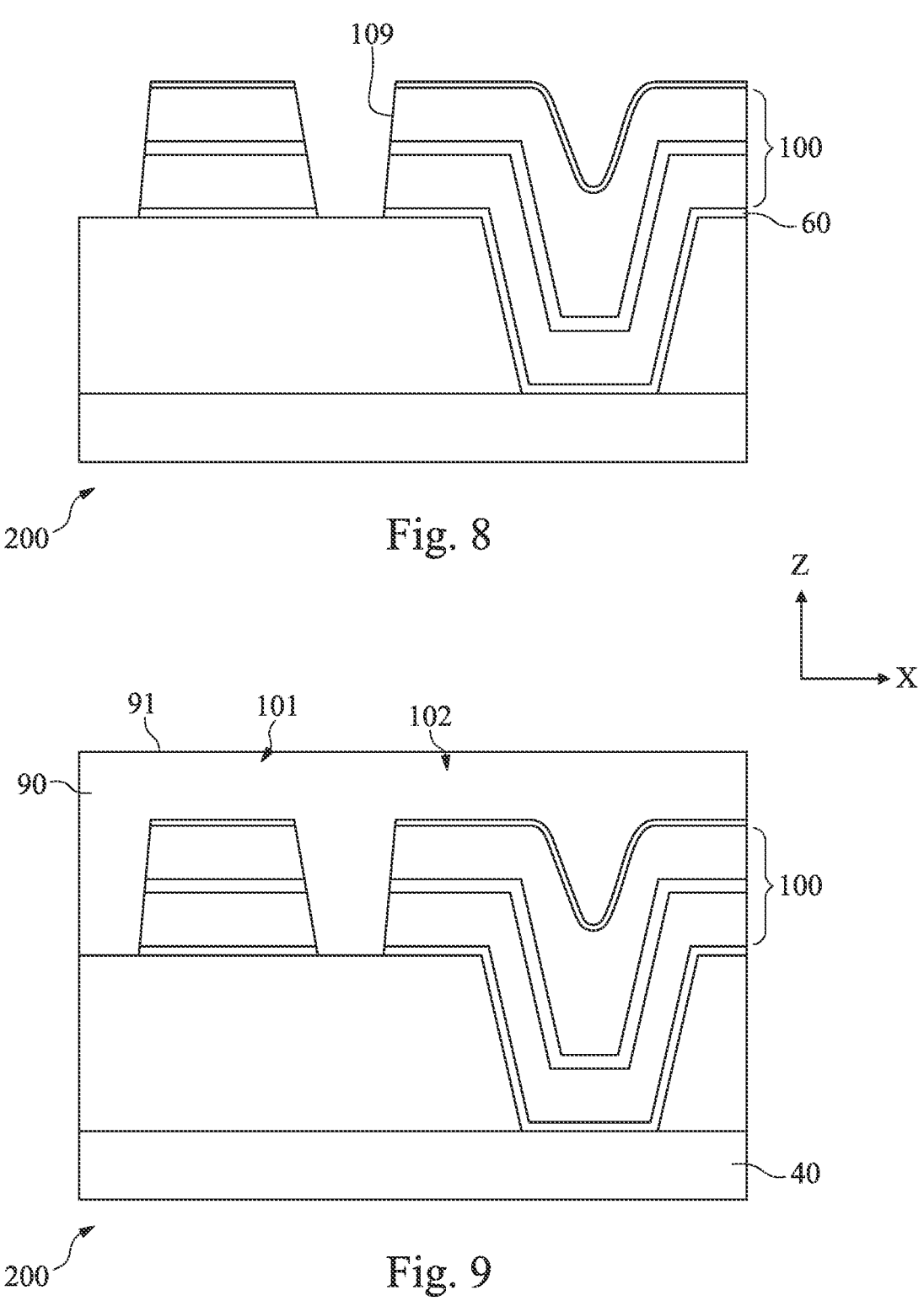

Cross-referencing FIGS. 1 and 8, method 10 further includes, at S21, etching the aluminum structure 100 through the holes 81 in the mask 80. In exemplary embodiments, the etch process also etches through the metal diffusion barrier 60. An exemplary etch process is a wet etch with appropriate chemistries. As a result of the etching process, the aluminum structure 100 is formed with sidewalls 109 formed by the aluminum layers 110, 120 and the migration barrier layer 130.

As shown in FIG. 8, method 10 may further include, at S22, removing the mask 80 after etching the aluminum structure 100. The coating 70 may remain over the aluminum structure 100.

Cross-referencing FIGS. 1 and 9, method 10 further includes, at S23, forming a dielectric layer 90, such as a passivation layer 90, over the aluminum structure 100. In exemplary embodiments, the passivation layer 90 is silicon oxide ($SiO_2$) or silicon nitride (SiN). In exemplary embodiments, forming the passivation layer 90 includes depositing the passivation material and planarizing the upper surface 91 of the passivation material.

Method 10 is illustrated in FIGS. 2-10 as forming an aluminum structure 100 as a conductive line 101 that is isolated from the underlying conductive structure 40 in the cross-section view provided, and as a conductive via 102 that is electrically connected to the underlying conductive structure 40 in the cross-section view provided.

Method 10 may proceed with further processing at S24 to complete the semiconductor device 200.

Figure 10:
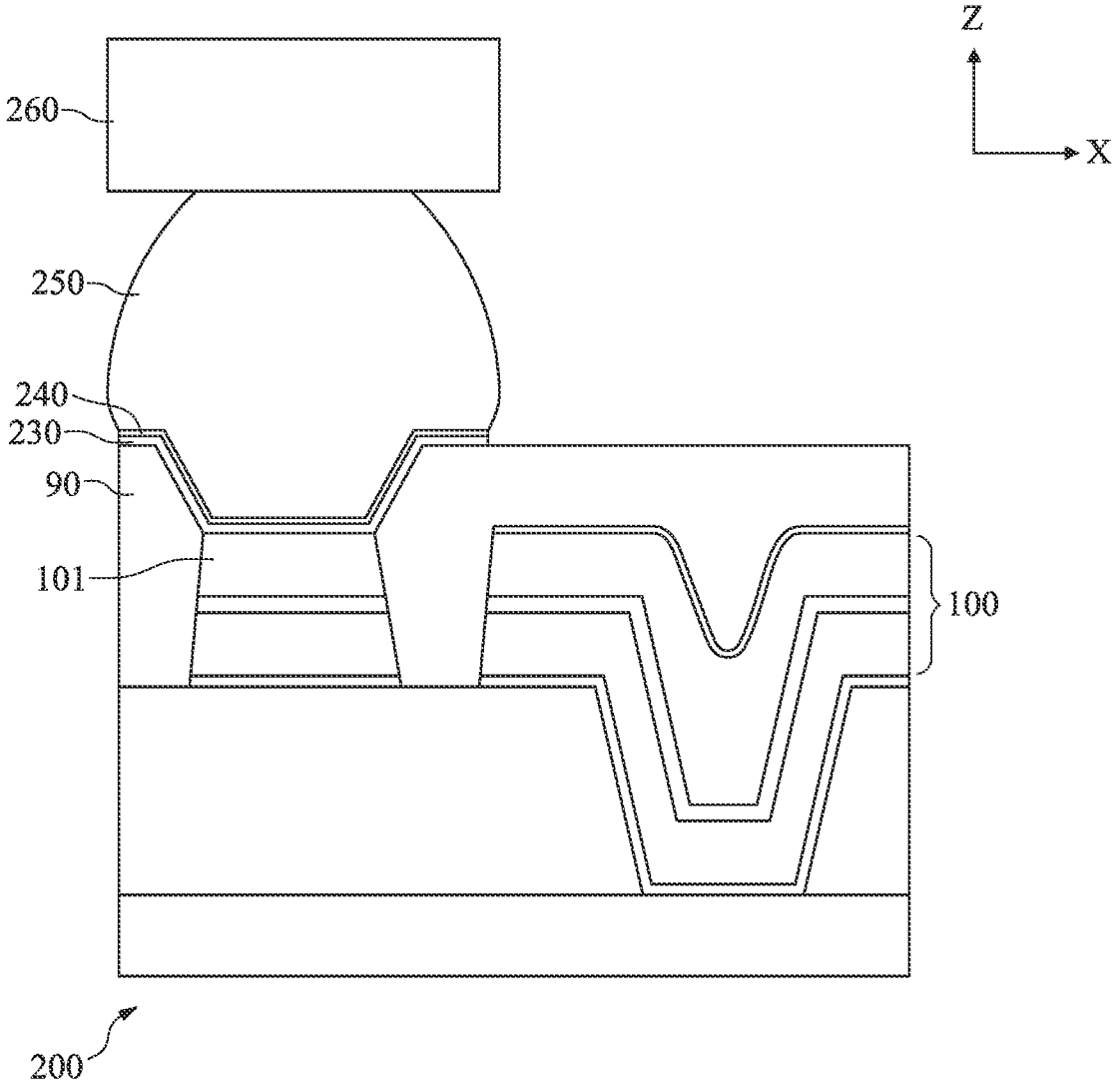

For example, as shown in FIG. 10, during advanced packaging processing, the passivation layer 90 may be etched over a selected portion of the aluminum structure 100, such as over via 101 as shown, and conductive liners 230 and 240 may be formed in contact with the aluminum structure 100. In certain embodiments other layers, such as seal layers, phosphor-silicate glass (PSG) layers, or other dielectric layer may also be formed as desired. Exemplary conductive liners 230 and 240 may be independently chromium, copper, or aluminum. As further shown, a solder bump 250 may be formed over the conductive liner 240 and in electrical connection to the aluminum structure 100. Further processing may electrically connect the solder bump 250 to additional conductive structures. For example, an integrated circuit die 260 may be electrically connected to the solder bump 250.

Figure 11:
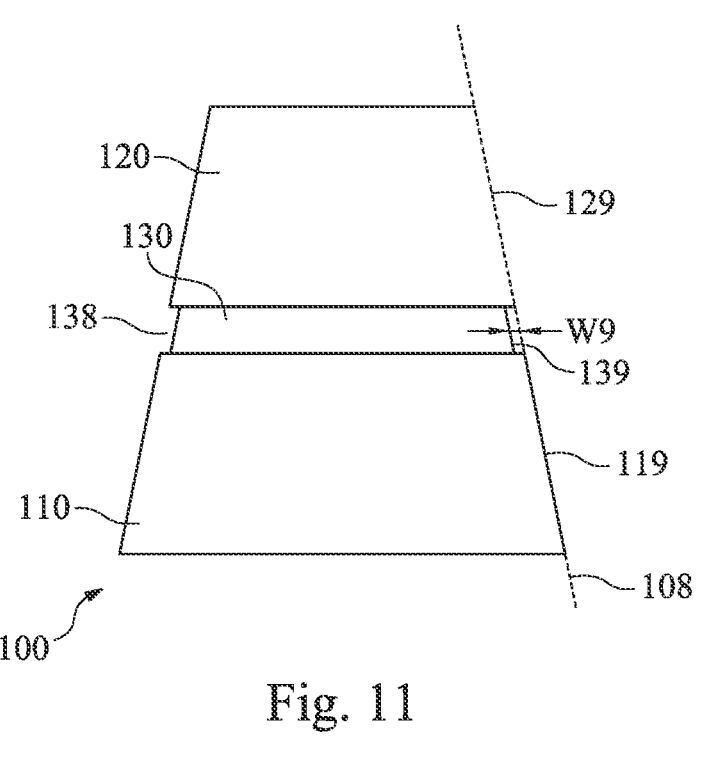
FIGS. 11-12 are focused cross-sectional views of the aluminum structure of FIG. 9, in accordance with some embodiments.
Figure 11:
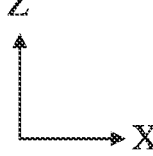

Referring to FIG. 11, details of an exemplary aluminum structure 100, such as a conductive line 101, are illustrated. As shown, the aluminum layer 110 has a lateral edge 119, the aluminum layer 120 has a lateral edge 129, and the migration barrier layer 130 has a lateral edge 139. During the etch process for etching the aluminum structure 100, the etchant may have a different selectively for the aluminum and the material of the migration barrier layer 130. Specifically, the migration barrier layer 130 may be etched more quickly. Therefore, an undercut portion or void 138 may be formed at the migration barrier layer 130. For example, the edges 119 and 129 of the aluminum layers 110 and 120 define a plane 108. The edge 139 of the migration barrier layer 130 is distanced from the plane 108 by the undercut portion 138, which has a width W9 in the x-direction. In exemplary embodiments, width W9 is less than 10 nanometers (nm).

Figure 12:
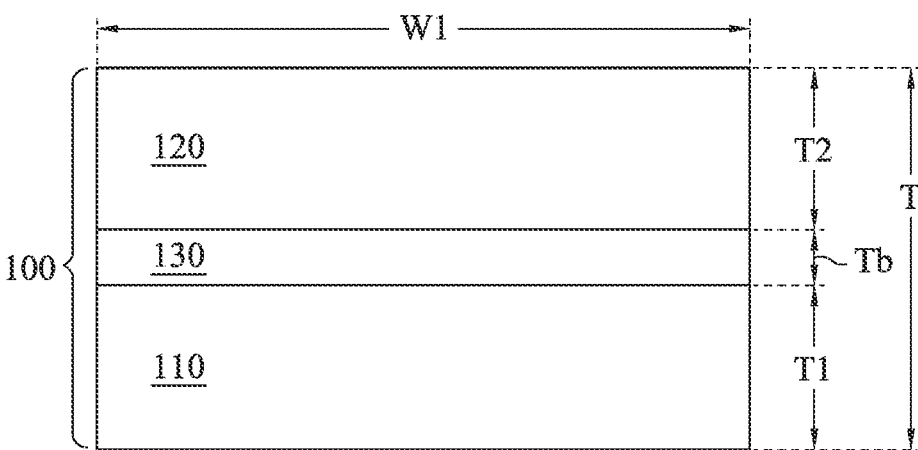
Figure 13:
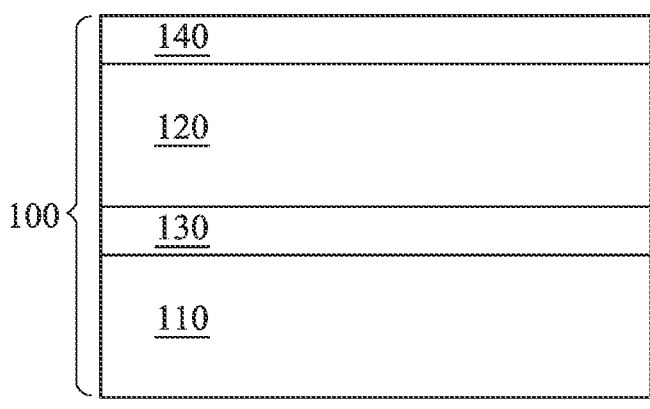
FIGS. 13-15 are focused cross-sectional views of alternative aluminum structures, in accordance with some embodiments.

Referring to FIG. 12, further details of an exemplary aluminum structure 100 are illustrated. As shown, the aluminum structure 100 has a thickness or height T in the z-direction. Further, aluminum layer 110 has a thickness or height T1 in the z-direction, and aluminum layer 120 has a thickness or height T2 in the z-direction. Likewise, migration barrier layer 130 has a thickness or height Tb in the z-direction.

In exemplary embodiments, the total thickness T is from 0.5 micrometers (500 nanometers) to 5 micrometers (5000 nanometers). For example, the total thickness T may be from 1 micrometer (1000 nanometers) to 3 micrometers (3000 nanometers). In exemplary embodiments, the migration barrier layer thickness Tb is less than 20 nanometers, such as less than 10 nanometers, for example less than 8 nanometers or less than 6 nanometers. In exemplary embodiments, the migration barrier layer thickness Tb is from 2 nanometers to 6 nanometers. In exemplary embodiments, migration barrier layer 130 has a thickness of at least 0.2 nanometers, such as at least 0.5 nanometers, at least 1 nanometer, at least 1.5 nanometers, at least 1.75 nanometers or at least 2 nanometers. In exemplary embodiments, migration barrier layer 130 has a thickness of no more than 5 nanometers, such as no more than 4 nanometers, no more than 3 nanometers, or no more than 2 nanometers. In exemplary embodiments, migration barrier layer 130 has a thickness of 2 nanometers. Thus, the migration barrier layer 130 is extremely thin as compared to the rest of the aluminum structure 100.

When referring to the total thicknesses or ratios of thicknesses between the aluminum layers 110 and 120, the thickness of the migration barrier layer may be ignored as being within the range of error. Thus, generally, the total thickness T is considered to be equal to the sum of T1 and T2.

In exemplary embodiments, aluminum layer 110 may form 25% of the total thickness T of the aluminum structure 100 and aluminum layer 120 may form 75% of the total thickness T of the aluminum structure 100. In such a structure 100, the ratio of T1:T is 1:4 and the ratio of T1:T2 is 1:3. In exemplary embodiments, aluminum layer 110 may form 75% of the total thickness T of the aluminum structure 100 and aluminum layer 120 may form 25% of the total thickness T of the aluminum structure 100. In such a structure 100, the ratio of T1:T is 3:4 and the ratio of T1:T2 is 3:1. In exemplary embodiments, aluminum layer 110 may form 50% of the total thickness T of the aluminum structure 100 and aluminum layer 120 may form 50% of the total thickness T of the aluminum structure 100. In such a structure 100, the ratio of T1:T is 1:2 and the ratio of T1:T2 is 1:1. Generally, the ratio of T1:T may be from 1:4 to 3:4 and the ratio of T1:T2 may be from 1:3 to 3:1. In certain embodiments, T1:T is from 25% to 75%, and T2/T is from 25% to 75% for purposes of process control.

In exemplary embodiments, either aluminum layer 110 or 120 may have a thickness of from 125 nanometers to 3750 nanometers.

As shown in FIG. 12, the aluminum structure 100 has width W1, extending between opposite sidewalls, in the x-direction, with the aluminum layer 110 and the aluminum layer 120 also having width W1 in the x-direction. In exemplary embodiments, width W1 is less than 2 micrometers. The migration barrier layer 130 has the same width W1, or as noted above, may have a width that is slightly less than width W1 due to the undercut portion. Given undercut portions at each end of the migration barrier layer 130, the width of the migration barrier layer 130 will be within 20 nanometers of width W1, i.e., no more than 20 nanometers less than width W1, or no less than width W1 minus 20 nanometers.

While FIGS. 2-12 illustrate an aluminum structure 100 including two aluminum layers 110 and 120 and one migration barrier layer 130, other embodiments are envisioned. For example, referring to FIG. 13, a second migration barrier layer 140 is formed from the upper surface 121 of the aluminum layer 120. Thus, the aluminum structure 100 includes first aluminum layer 110, first migration barrier layer 130, second aluminum layer 120, and second migration barrier layer 140. Second migration barrier layer 140 may be formed according to the process for forming migration barrier layer 130, and may have the same properties including thickness and width, as migration barrier layer 130.

Figure 14:
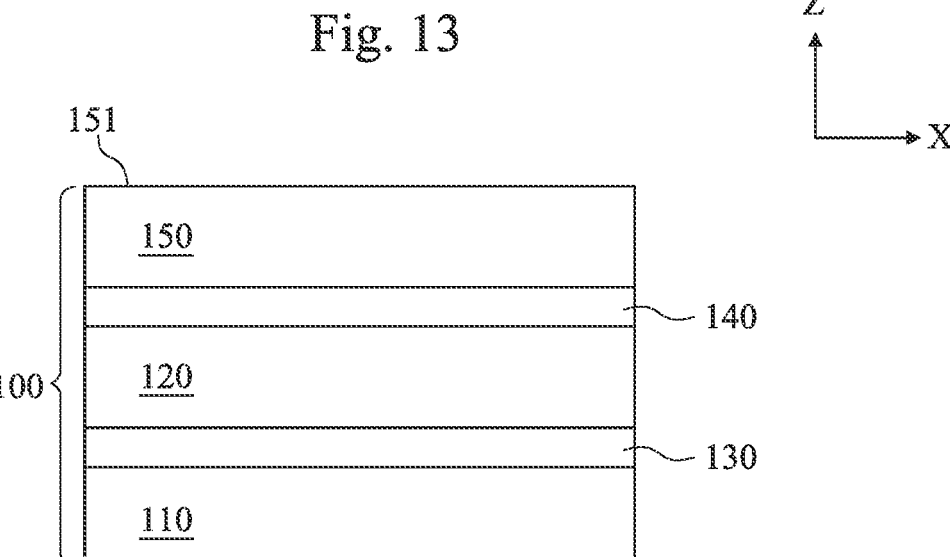

In FIG. 14, a third aluminum layer 150 is formed over the second migration barrier layer 140. Thus, the aluminum structure 100 includes first aluminum layer 110, first migration barrier layer 130, second aluminum layer 120, second migration barrier layer 140, and third aluminum layer 150. The third aluminum layer 150 has an upper surface 151 and may be formed according to the process for forming aluminum layers 110 and/or 120, and may have the same properties including thickness and width, as aluminum layers 110 and/or 120. In exemplary embodiments, the thickness of layers 110, 120 and 150 may differ. For example, layer 110 may have a thickness T1, layer 120 may have a thickness T2, and layer 150 may have a thickness T3, wherein each of T1, T2, and T3 is at least ⅙ of a total thickness T of the aluminum structure 100, and no more than ⅔ of the total thickness T of the aluminum structure.

Figure 15:
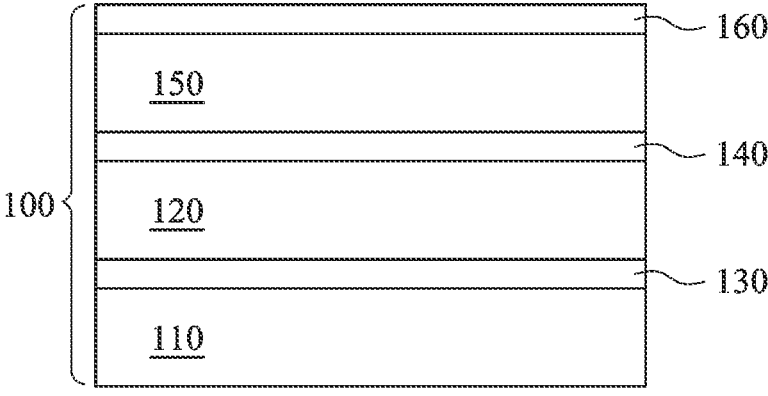

In FIG. 15, a third migration barrier layer 160 is formed from the upper surface 151 of the aluminum layer 150. Thus, the aluminum structure 100 includes first aluminum layer 110, first migration barrier layer 130, second aluminum layer 120, second migration barrier layer 140, third aluminum layer 150, and third migration barrier layer 160. Third migration barrier layer 160 may be formed according to the process for forming, and may have the same properties including thickness and width, as migration barrier layers 130 and/or 140.

As may be understood, the aluminum structure may be formed with any suitable desired number of aluminum layers separated by migration barrier layers, and may or may not include a migration barrier layer over the uppermost aluminum layer.

The difference in coefficient of thermal expansion (CTE) between adjacent materials may cause stress-driven void merging during thermal cycling. Aluminum has a CTE of from 20 to 25 ppm, such as 23 ppm. $SiO_2$ has a CTE of from 0.25 to 1 ppm, such as 0.5 ppm; and SiN has CTE of from 2 to 3 ppm, such as 2.4 ppm. AlN has a CTE of from 4.5 to 6 ppm such as 5.3, and $Al_2O_3$ has a CTE of from 6.5 to 8 ppm, such as 7.3 ppm. Thus, providing a migration barrier layer 130 of AlN or $Al_2O_3$ may reduce the diffusion of vacancies that otherwise would merge to form voids. Specifically, the migration barrier layer 130 may block vacancy diffusion.

Thus, one of the embodiments of the present disclosure describes a device including an interconnect structure and an aluminum structure electrically connected to the interconnect structure. The aluminum structure includes a first aluminum layer; a migration barrier layer over the first aluminum layer; and a second aluminum layer over the migration barrier layer.

In certain embodiments, the device further includes a dielectric layer over the interconnect structure, wherein the dielectric layer comprises silicon oxide ($SiO_2$).

In certain embodiments of the device, the aluminum structure has a height in a z-direction of from 0.5 micrometers to 5 micrometers, and wherein the migration barrier layer has a thickness in the z-direction of from 2 nanometers to 6 nanometers.

In certain embodiments of the device, the first aluminum layer has a thickness T1 in a z-direction, wherein the second aluminum layer has a thickness T2 in the z-direction, and wherein T1:T2 is from 3:1 to 1:3.

In certain embodiments of the device, the migration barrier layer comprises aluminum oxide, aluminum nitride, and/or aluminum oxynitride.

In certain embodiments of the device, the migration barrier layer is a first migration barrier layer and the device further includes a second migration barrier layer over the second aluminum layer; and a third aluminum layer over the second migration barrier layer.

In certain embodiments of the device, the migration barrier layer is a ceramic layer.

In certain embodiments of the device, the first aluminum layer has a first lateral edge; the second aluminum layer has a second lateral edge; the migration barrier layer has a barrier lateral edge; the first lateral edge and the second lateral edge define a plane; and the barrier lateral edge is distanced from the plane by less than 10 nanometers (nm).

In another embodiment, a semiconductor device is provided and includes a first aluminum layer; a ceramic layer directly on the first aluminum layer, wherein the ceramic layer is comprised of aluminum oxide, aluminum nitride, and/or aluminum oxynitride; and a second aluminum layer directly on the ceramic layer.

In certain embodiments, the device further includes an interconnect structure; and a dielectric layer lying over the interconnect structure, wherein the first aluminum layer, the ceramic layer, and the second aluminum layer comprise a conductive line, and wherein the conductive line lies over the dielectric layer.

In certain embodiments of the device, the first aluminum layer has thickness in a z-direction of from 125 to 3750 nm; the ceramic layer has thickness in a z-direction of from 2 to 6 nm; and the second aluminum layer has thickness in the z-direction of from 125 to 3750 nm. In such embodiments, the first aluminum layer may have a first width in an x-direction of less than 2 micrometers; the ceramic layer may have a ceramic width in the x-direction of less than 2 micrometers; and the second aluminum layer may have a second width in the x-direction of less than 2 micrometers. In such embodiments, the ceramic width is no more than 20 nm less than the first width and the second width.

A method for fabricating a semiconductor device is also provided and includes depositing a first layer of aluminum, wherein the first layer of aluminum has an upper surface; treating the upper surface of the first layer of aluminum to form a migration barrier layer, wherein a remainder of the first layer of aluminum under the migration barrier layer remains unmodified; and depositing a second layer of aluminum over the migration barrier layer.

In certain embodiments of the method, the migration barrier layer is a first migration barrier layer, the second layer of aluminum has an upper surface, and the method further includes treating the upper surface of the second layer of aluminum to form a second migration barrier layer, wherein a remainder of the second layer of aluminum under the second migration barrier layer remains unmodified; and depositing a third layer of aluminum over the second migration barrier layer.

In certain embodiments, the method includes etching the second layer of aluminum, the migration barrier layer, and the first layer of aluminum to form a conductive line having a first sidewall and a second sidewall, wherein the conductive line has a line width in an x-direction from the first sidewall to the second sidewall, and wherein the line width is less than 2 micrometers.

In certain embodiments, the method further includes etching the second layer of aluminum, the migration barrier layer, and the first layer of aluminum to form a conductive structure having a first sidewall; and depositing a dielectric material over the conductive structure. In certain embodiments, when etching the second layer of aluminum, the migration barrier layer, and the first layer of aluminum to form a conductive structure having a first sidewall an undercut void is formed from an edge of the migration barrier layer, and the undercut void has a width of less than 10 nanometers (nm). In certain embodiments, after etching the second layer of aluminum, the migration barrier layer, and the first layer of aluminum to form a conductive structure having a first sidewall the first layer of aluminum has a first lateral edge, the second layer of aluminum has a second lateral edge, the migration barrier layer has a barrier lateral edge, the first lateral edge and the second lateral edge define a plane, and the barrier lateral edge is distanced from the plane by less than 10 nanometers (nm).

In certain embodiments of the method, treating the upper surface of the first layer of aluminum to form the migration barrier layer includes forming an aluminum nitride layer, an aluminum oxide layer, or an aluminum oxynitride layer.

In certain embodiments of the method, treating the upper surface of the first layer of aluminum to form the migration barrier layer comprises forming a ceramic layer from the upper surface of the first layer of aluminum.

In certain embodiments of the method, treating the upper surface of the first layer of aluminum to form the migration barrier layer comprises performing a vacuum break and forming native aluminum oxide on the upper surface of the first layer of aluminum.

In certain embodiments of the method, treating the upper surface of the first layer of aluminum to form the migration barrier layer comprises performing a plasma ionization process with oxygen ($O_2$), nitrogen ($N_2$), or nitrous oxide ($N_2O$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A device comprising:
an interconnect structure; and
an aluminum structure electrically connected to the interconnect structure, wherein the aluminum structure comprises:
a first aluminum layer;
a migration barrier layer over the first aluminum layer; and
a second aluminum layer over the migration barrier layer; wherein the aluminum structure has a sidewall formed by the first aluminum layer, the migration barrier layer, and the second aluminum layer, and wherein the sidewall includes an undercut portion at the migration barrier layer.

2. The device of claim 1, further comprising a dielectric layer over the interconnect structure, wherein the dielectric layer contacts the sidewall at the migration barrier layer.

3. The device of claim 1, wherein the aluminum structure has a height in a z-direction of from 0.5 micrometers to 5 micrometers, and wherein the migration barrier layer has a thickness in the z-direction of from 2 nanometers to 6 nanometers.

4. The device of claim 1, wherein the first aluminum layer has a thickness T1 in a z-direction, wherein the second aluminum layer has a thickness T2 in the z-direction, and wherein T1:T2 is from 3:1 to 1:3.

5. The device of claim 1, wherein the migration barrier layer is a first migration barrier layer and wherein the device further comprises:

a second migration barrier layer over the second aluminum layer; and a third aluminum layer over the second migration barrier layer.

6. The device of claim 1, wherein the migration barrier layer comprises aluminum oxide, aluminum nitride, and/or aluminum oxynitride, and/or is a ceramic layer.

7. The device of claim 1, wherein:

the first aluminum layer has a first lateral edge forming a portion of the sidewall;

the second aluminum layer has a second lateral edge forming a portion of the sidewall;

the migration barrier layer has a barrier lateral edge forming a portion of the sidewall;

the first lateral edge and the second lateral edge define a plane; and the barrier lateral edge is distanced from the plane by less than 10 nanometers (nm) to define the undercut portion between the first aluminum layer and the second aluminum layer.

8. A semiconductor device comprising:

a first aluminum layer;

a ceramic layer directly on the first aluminum layer, wherein the ceramic layer is comprised of aluminum oxide, aluminum nitride, and/or aluminum oxynitride; and a second aluminum layer directly on the ceramic layer, wherein the first aluminum layer, the ceramic layer, and the second aluminum layer form a conductive structure having a sidewall, and wherein the sidewall includes an undercut portion at the ceramic layer.

9. The semiconductor device of claim 8, further comprising:

an interconnect structure;

a dielectric layer lying over the interconnect structure; and a metal diffusion barrier over the dielectric layer and over an uncovered portion of an upper surface of the interconnect structure, wherein the metal diffusion barrier comprises tantalum nitride (TaN) or titanium nitride (TiN);

wherein the first aluminum layer, the ceramic layer, and the second aluminum layer comprise a conductive via extending through the dielectric layer to electrically contact the interconnect structure, and wherein the first aluminum layer is on the metal diffusion barrier.

10. The semiconductor device of claim 9, further comprising a passivation layer over the conductive via, wherein the passivation layer comprises silicon oxide (SiO$_2$) or silicon nitride (SiN), and wherein the passivation layer has a planarized upper surface.

11. The semiconductor device of claim 10, further comprising:

an opening through the passivation layer exposing a portion of the second aluminum layer;

a conductive liner over the second aluminum layer in the opening, wherein the conductive liner comprises chromium, copper, or aluminum; and a solder bump over the conductive liner and in electrical connection with the aluminum structure.

12. A method for fabricating a semiconductor device comprising:

depositing a first layer of aluminum, wherein the first layer of aluminum has an upper surface;

treating the upper surface of the first layer of aluminum to form a migration barrier layer by performing a vacuum break and forming native aluminum oxide on the upper surface of the first layer of aluminum, wherein a remainder of the first layer of aluminum under the migration barrier layer remains unmodified; and depositing a second layer of aluminum over the migration barrier layer.

13. The method of claim 12, wherein the migration barrier layer is a first migration barrier layer and wherein the second layer of aluminum has an upper surface, the method further comprising:

treating the upper surface of the second layer of aluminum to form a second migration barrier layer, wherein a remainder of the second layer of aluminum under the second migration barrier layer remains unmodified; and depositing a third layer of aluminum over the second migration barrier layer.

14. The method of claim 12, further comprising:

etching the second layer of aluminum, the migration barrier layer, and the first layer of aluminum to form a conductive line having a first sidewall and a second sidewall, wherein the conductive line has a line width in an x-direction from the first sidewall to the second sidewall, and wherein the line width is less than 2 micrometers.

15. The method of claim 12, further comprising:

etching the second layer of aluminum, the migration barrier layer, and the first layer of aluminum to form a conductive structure having a first sidewall; and depositing a dielectric material over the conductive structure.

16. The method of claim 15, wherein when etching the second layer of aluminum, the migration barrier layer, and the first layer of aluminum to form a conductive structure having a first sidewall an undercut void is formed from an edge of the migration barrier layer, and wherein the undercut void has a width of less than 10 nanometers (nm).

17. The method of claim 15, wherein after etching the second layer of aluminum, the migration barrier layer, and the first layer of aluminum to form a conductive structure having a first sidewall the first layer of aluminum has a first lateral edge, the second layer of aluminum has a second lateral edge, the migration barrier layer has a barrier lateral edge, the first lateral edge and the second lateral edge define a plane, and the barrier lateral edge is distanced from the plane by less than 10 nanometers (nm).

18. The method of claim 12, wherein treating the upper surface of the first layer of aluminum to form the migration barrier layer further comprises incorporating nitrogen into a portion of the native aluminum oxide to form an aluminum oxynitride layer.

19. The method of claim 12, wherein treating the upper surface of the first layer of aluminum to form the migration barrier layer further comprises performing a plasma ionization process with oxygen (O$_2$), nitrogen (N$_2$), or nitrous oxide (N$_2$O) after the vacuum break.

20. The method of claim 19, wherein the plasma ionization process is performed at a temperature of from 25 to 400° C., at a pressure of from 0.001 to 10 torr, and for a time duration of from 10 to 120 seconds.

* * * * *